(12) United States Patent
Bae

(10) Patent No.: US 6,657,258 B2
(45) Date of Patent: Dec. 2, 2003

(54) SEMICONDUCTOR DEVICE HAVING QUASI-SOI STRUCTURE

(75) Inventor: Geum-jong Bae, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/201,781

(22) Filed: Jul. 25, 2002

(65) Prior Publication Data

US 2002/0182787 A1 Dec. 5, 2002

Related U.S. Application Data

(62) Division of application No. 09/686,883, filed on Oct. 12, 2000, now Pat. No. 6,448,115.

(30) Foreign Application Priority Data

Oct. 12, 1999 (KR) ............................................ 99-43988

(51) Int. Cl.[7] ........................... H01L 27/04; H01L 29/06
(52) U.S. Cl. ..................... 257/347; 257/618; 257/622
(58) Field of Search ................................ 257/347, 618, 257/622

(56) References Cited

U.S. PATENT DOCUMENTS 5,712,173 A     1/1998  Liu et al.
5,972,758 A  *  10/1999 Liang ........................ 438/294
2001/0042890 A1 * 11/2001 Liang ........................ 257/374

FOREIGN PATENT DOCUMENTS

KR    2001008504 A  *  2/2001   ........... H01L/21/76

* cited by examiner

Primary Examiner—Allan R. Wilson
(74) Attorney, Agent, or Firm—Volentine Francos, PLLC

(57) ABSTRACT

A semiconductor device having a silicon-on-insulator (SOI) structure includes a lower silicon substrate and an upper silicon pattern electrically insulated from the lower silicon pattern by an isolating insulation layer buried by a reverse T-type hole formed in the lower silicon substrate. A gate insulation layer and a gate electrode are formed over the upper silicon pattern, and source/drain regions are formed in the upper silicon pattern centered around the gate electrode. Also, a channel region is disposed between the source/drain region. A silicon layer or a porous silicon layer is formed under the channel region for electrically connecting the lower silicon substrate and the upper silicon pattern. A body contact, which is the same as that of a general semiconductor device, is thus allowed without a special change in the design of the semiconductor device.

3 Claims, 9 Drawing Sheets

SEMICONDUCTOR DEVICE HAVING QUASI-SOI STRUCTURE

CROSS REFERENCE TO RELATED APPLICATIONS

This is a divisional application of application Ser. No. 09/686,883, filed Oct. 12, 2000, now U.S. Pat. No. 6,448,115, which is hereby incorporated by reference in its entirety for all purposes.

This application relies for priority upon Korean Patent Application No. 99-43988, filed on Oct. 12, 1999, the contents of which are herein incorporated by reference in their entirety.

BACKGROUND OF THE INVENTION

The present invention relates to a semiconductor device and a manufacturing method thereof. More particularly, the present invention relates to a semiconductor device having a quasi silicon-on-insulator (SOI) structure, and a manufacturing method thereof.

In general, silicon substrates are widely used in semiconductor devices. However, silicon substrates have several drawbacks. In particular, it is difficult to form a thin source/drain region and to reduce a parasitic junction capacitance that is produced in the junction area between the silicon substrate and the source/drain region. This can detrimentally effect the operation speed of the device.

Accordingly, a semiconductor device having a silicon-on-insulator (SOI) structure has been proposed. An SOI semiconductor device is constructed such that a silicon layer on which a unit device is formed is completely electrically insulated from a lower silicon substrate by an insulation layer. This reduces the capacitive coupling occurring between unit devices formed in an integrated circuit (IC) chip.

An SOI semiconductor device has a large threshold slope and exhibits little decrease in the device characteristic even at a low voltage of less than 2 V. In particular, a thin SOI device exhibits excellent characteristics, such as a decrease in the short channel effect, an increase in the sub-threshold swing, high mobility, and a decrease in the hot carrier effect, compared to existing semiconductor devices.

However, unlike in a conventional semiconductor device, in an SOI semiconductor device, an active region is isolated from a silicon substrate so that body contact is not formed, resulting in floating body effects. Floating body effects occur when excess carriers are accumulated in a floated body during device operation, and parasitic bipolar-induced breakdown or latch-up is accordingly induced.

To solve the above problems, a semiconductor device has been proposed having a quasi-SOI structure, in which a body contact is formed for extracting excess carriers by partially forming contact hole under the active region.

FIG. 1 shows a conventional semiconductor device having a quasi-SOI structure.

In detail, according to the conventional semiconductor device having a quasi-SOI structure, an oxide layer 10 is formed under a source region 3 and a drain region 5 that are to be insulated from a lower silicon substrate 1. However, the body region under a channel region is opened so that it is not insulated from the lower silicon substrate 1. As a result, a body contact can be formed in the same manner as in a bulk device. In FIG. 1, reference numerals 2, 7 and 9 denote a field oxide layer, a gate oxide layer, and a gate electrode, respectively.

In the conventional SOI semiconductor device, the oxide layer 10 is formed by implanting oxygen ions using the gate electrode 9 as a mask and then performing high-temperature annealing on the resultant structure. However, since the gate oxide layer 7 or the ion implanted state of the channel region may be affected by ion implantation or annealing, the conventional SOI semiconductor device has drawbacks in practical fabrication.

SUMMARY OF THE INVENTION

It is, therefore, an objective of the present invention to provide a semiconductor device having a quasi-SOI structure with a body contact capable of suppressing floating body effects while solving the problems set forth above.

It is another objective of the present invention to provide a method suitable for manufacturing the semiconductor device having such a quasi-SOI structure.

Accordingly, to achieve the first objective, a semiconductor device having a silicon-on-insulator (SOI) structure, includes a lower silicon substrate; an upper silicon pattern formed over the lower silicon substrate; a reverse T-type hole formed between the upper silicon pattern and the lower silicon substrate; an isolating insulation layer formed in the reverse T-type hole for partially electrically insulating the upper silicon pattern from the lower silicon substrate; a gate insulation layer and a gate electrode formed over the upper silicon pattern; a source region formed in the upper silicon pattern adjacent to the gate electrode; a drain region formed in the upper silicon pattern adjacent to the gate electrode; a channel region formed in the upper silicon pattern between the source and drain regions; and a silicon layer formed under the channel region for electrically connecting the lower silicon substrate and the upper silicon pattern.

The silicon layer is preferably a porous silicon layer. An air layer may be formed in the isolating insulation layer below the upper silicon pattern. The upper silicon pattern is preferably a single-crystal silicon layer.

To achieve the second objective, in the present invention, a method is provided for manufacturing a semiconductor device having an SOI structure. In this method, a porous silicon pattern is formed over a lower silicon substrate. An upper silicon pattern is then formed over the a porous silicon pattern. A hole is then formed in the upper silicon pattern and the porous silicon pattern to expose the lower silicon substrate. A reverse T-type hole and an undercut porous silicon pattern are then formed under the upper silicon pattern by partially etching the porous silicon pattern, the resulting undercut porous silicon pattern partially electrically contacting the lower silicon substrate and the upper silicon pattern. The lower silicon substrate is partially electrically isolated from the upper silicon pattern by forming an isolating insulation layer in the reverse T-type hole. A gate insulation layer and a gate electrode are formed over the upper silicon pattern, and source and drain regions are formed in the upper silicon pattern.

In this method, a mask pattern may also be formed over the upper silicon layer. In this case, the hole is formed in the upper silicon pattern and the porous silicon pattern by sequentially etching the upper silicon layer and the porous silicon layer using the mask pattern as a mask.

In the forming of the isolating insulation layer, an insulation layer may be formed over the upper silicon pattern and in the reverse T-type hole. This insulation layer is then subsequently planarized by etching, at which time the mask pattern is simultaneously removed.

In the forming of the porous silicon layer, an impurity-containing silicon layer may be formed over the lower silicon substrate, and silicon can then be extracted from the impurity-containing silicon layer.

In this method, a thermal oxide layer may be formed over an entire exposed surface in the reverse T-type hole. Also, an air layer may be formed in the isolating insulation layer under the upper silicon pattern adjacent to the undercut porous silicon layer.

The undercut porous silicon pattern may be obtained by isotropically etching the porous silicon pattern.

According to another aspect of the present invention, another method is provided for manufacturing a semiconductor device having an SOI structure. In this method, a porous silicon layer is formed in a lower silicon substrate to define a first region of the lower silicon substrate. An upper silicon layer is then formed over the porous silicon layer and the lower silicon substrate. A hole is then formed in the upper silicon layer and the porous silicon layer to expose a second region of the lower silicon substrate and to define an upper silicon pattern and a porous silicon pattern. A reverse T-type hole is formed by removing the porous silicon pattern, and at the same time partially electrically contacting the lower silicon substrate and the upper silicon pattern through the first region of the lower silicon substrate. The lower silicon substrate is partially electrically isolated from the upper silicon pattern by forming an isolating insulation layer in the reverse T-type hole. A gate insulation layer and a gate electrode are formed over the upper silicon pattern, and source and drain regions are formed in the upper silicon pattern.

In the forming of the porous silicon layer, a first mask pattern may be formed over the lower silicon substrate. An impurity region is then selectively formed in an exposed portion of the lower silicon substrate by implanting impurities in the exposed portion of the lower silicon substrate using the first mask pattern as a mask. The porous silicon layer is then formed by extracting silicon from the impurity region, and the first mask pattern is removed.

The method may also include forming a thermal oxide layer over an entire exposed surface in the reverse T-type hole. In the forming of a hole in the upper silicon layer and the porous silicon layer, a second mask pattern may be formed over the upper silicon layer and the porous silicon layer lower silicon substrate. The upper silicon layer and the porous silicon layer may then be sequentially etched using the second mask pattern as a mask.

In the forming of the isolating insulation layer, an insulation layer may be formed over the upper silicon payer and in the reverse T-type hole. The insulation layer may then be planarized by etching, at which time the second mask pattern is simultaneously removed.

When forming the isolating insulation layer, an air layer may be formed under the upper silicon pattern.

According to the semiconductor device having an SOI structure of the present invention, a body contact that is the same as that of a general semiconductor device is allowed without requiring a special change in the design of the semiconductor device.

BRIEF DESCRIPTION OF THE DRAWINGS

The above objectives and advantages of the present invention will become more apparent by describing in detail a preferred embodiments thereof with reference to the attached drawings in which.

DESCRIPTION OF THE PREFERRED EMBODIMENTS

Figure 1:
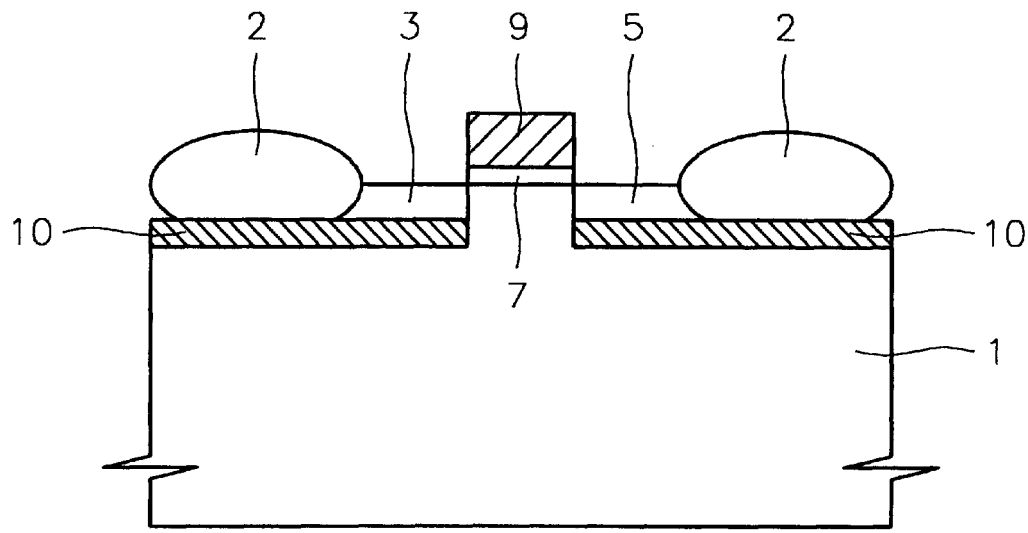
FIG. 1 shows a conventional semiconductor device having a quasi-SOI structure.
Figure 2:
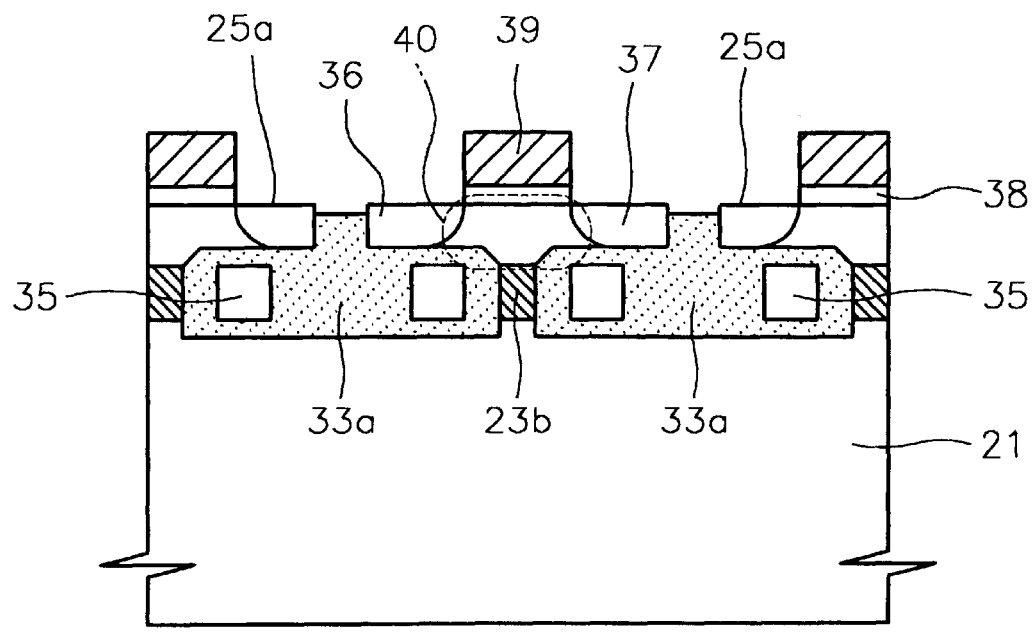
FIG. 2 is a cross-sectional view illustrating a semiconductor device having a quasi-SOI structure according to a first preferred embodiment of the present invention.

A semiconductor device having a quasi-SOI structure according to a first preferably embodiment of the present invention is shown in FIG. 2.

Referring to FIG. 2, portions of an upper silicon layer 25a are isolated from each other by an isolating insulation layer 33a. The upper silicon layer 25a includes a source region 36, a drain region 37, and a channel region 40 disposed between the source region 36 and the drain region 37. A gate insulation layer 38 and a gate electrode 39 are formed over the upper silicon layer 25a and the channel region 40.

The upper silicon layer 25a is partially isolated from a silicon substrate 21 (lower silicon layer) by the isolating insulation layer 33a. A porous silicon layer 23b is formed under the channel region 40. The porous silicon layer 23b becomes a passage for partial contact between the lower silicon layer 21 (the silicon substrate) and the upper silicon layer 25a, thereby allowing a body contact which is the same as the conventional body contact.

Furthermore, the semiconductor having a quasi-SOI structure according to preferred embodiments of the present invention includes a silicon-on-air (SOA) structure produced by forming an air layer 35 in the isolating insulation layer 33a disposed under the upper silicon layer 25a. Since the air layer 35 has a dielectric constant lower than that of the oxide layer used as the insulation layer in a conventional SOI semiconductor device, more effective device characteristics can be obtained.

Figure 3:
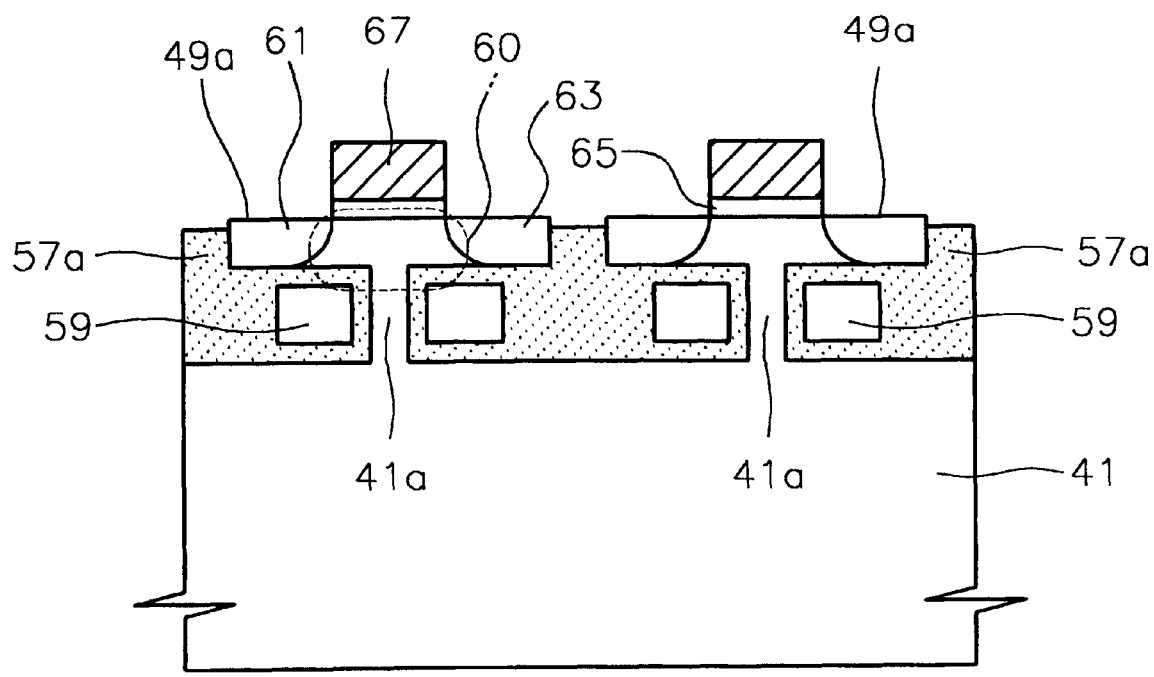
FIG. 3 is a cross-sectional view illustrating a semiconductor device having a quasi-SOI structure according to a second preferred embodiment of the present invention.

FIG. 3 is a cross-sectional view illustrating a semiconductor device having a quasi-SOI structure according to a second preferred embodiment of the present invention.

Referring to FIG. 3, portions of an upper silicon layer 49a are isolated from each other by an isolating insulation layer 57a. The upper silicon layer 49a includes a source region 61, a drain region 63, and a channel region 60 disposed between the source region 61 and the drain region 63. A gate insulation layer 65 and a gate electrode 67 are formed over the upper silicon layer 49a and the channel region 60.

The upper silicon layer 49a is partially isolated from a silicon substrate 41 (lower silicon layer) by the isolating insulation layer 57a. However, a silicon layer 41a is formed under the channel region 60 and connects the upper silicon layer 49a in the channel region 60 to the lower silicon layer 41. The silicon layer 41a thus becomes a passage for partial contact between the lower silicon layer 41 and the upper silicon layer 49a, thereby allowing a body contact similar to a conventional body contact.

Furthermore, the semiconductor having a quasi-SOI structure according to the present invention also includes a silicon-on-air (SOA) structure produced by forming an air layer 59 in the isolating insulation layer 57a disposed under the upper silicon layer 49a. Since the air layer 59 has a dielectric constant lower than that of the oxide layer used as the insulation layer in a conventional SOI semiconductor device, more effective device characteristics can be obtained.

FIGS. 4 through 9 are cross-sectional views respectively illustrating the manufacturing process sequence of the semiconductor device of FIG. 2, respectively.

Figure 4:
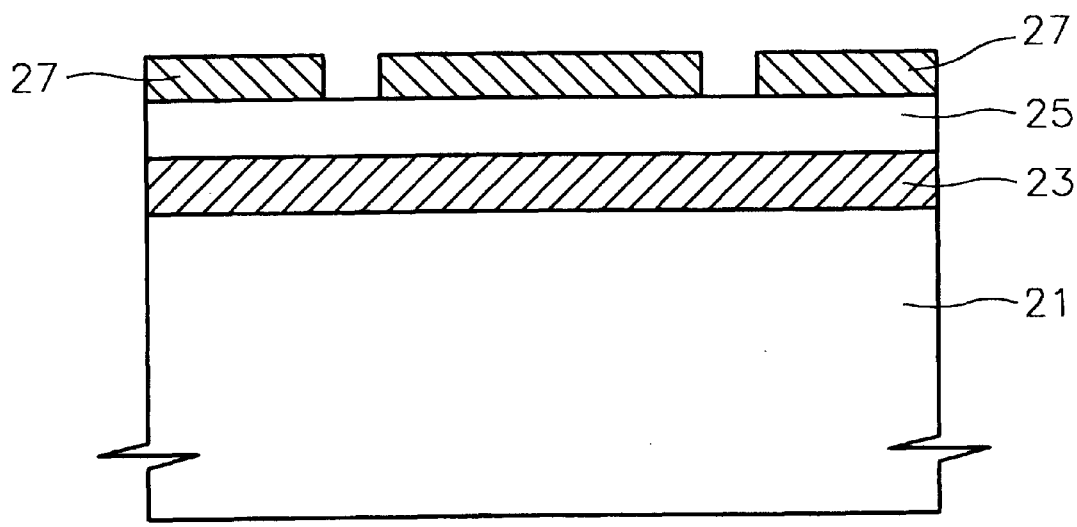
FIGS. 4 through 9 are cross-sectional views respectively illustrating the manufacturing process sequence of the semiconductor device of FIG. 2.

Referring to FIG. 4, a porous silicon layer 23 is initially formed over a silicon substrate 21 (lower silicon layer) by an anodizing method. In other words, an impurity-containing silicon layer (not shown) is formed over the lower silicon substrate 21 and then silicon is extracted from the impurity-containing silicon layer, thereby forming the porous silicon layer 23.

Subsequently, a single-crystal upper silicon layer 25 is formed over the porous silicon layer 23, preferably using an epitaxy method. A mask pattern 27 is then formed over the upper silicon layer 25. In this embodiment, the mask pattern 27 is preferably formed using a photolithography method after forming a nitride layer (not shown) over the upper silicon layer 25.

Figure 5:
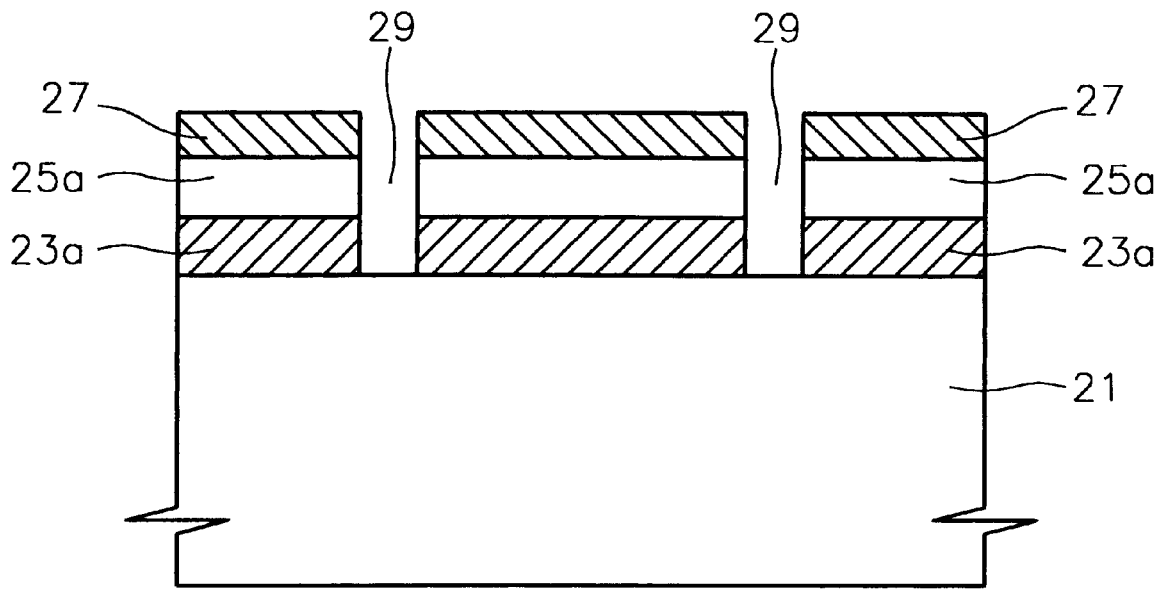

Referring to FIG. 5, the upper silicon layer 25 and the porous silicon layer 23 are then etched using the mask pattern 27 as an etching mask, thereby forming an upper silicon layer pattern 25a and a porous silicon pattern 23a. A hole 29 is formed to open the surface of the lower silicon substrate 21 and to expose side walls of the porous silicon pattern 23a.

Figure 6:
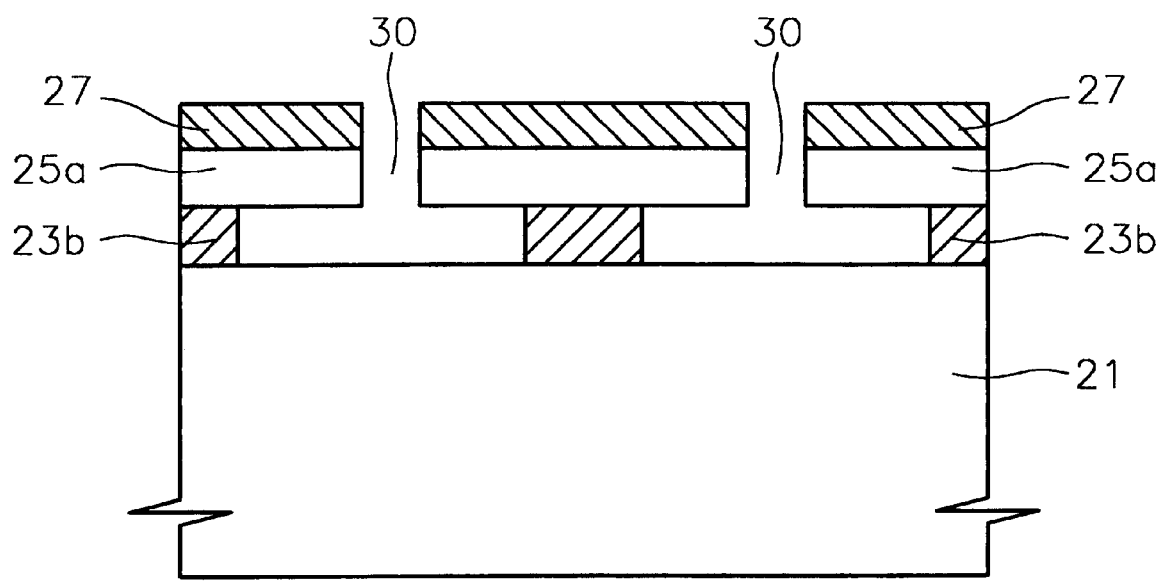

Referring to FIG. 6, the porous silicon pattern 23a is then isotropically etched using diluted HF solution having a high etching selectivity with respect to silicon. The etching degree is adjusted such that a portion the porous silicon pattern 23a is etched under the upper silicon pattern 25a, thereby forming an undercut porous silicon pattern 23b and a reverse T-type hole 30 for opening the surface of the lower silicon substrate 21.

Figure 7:
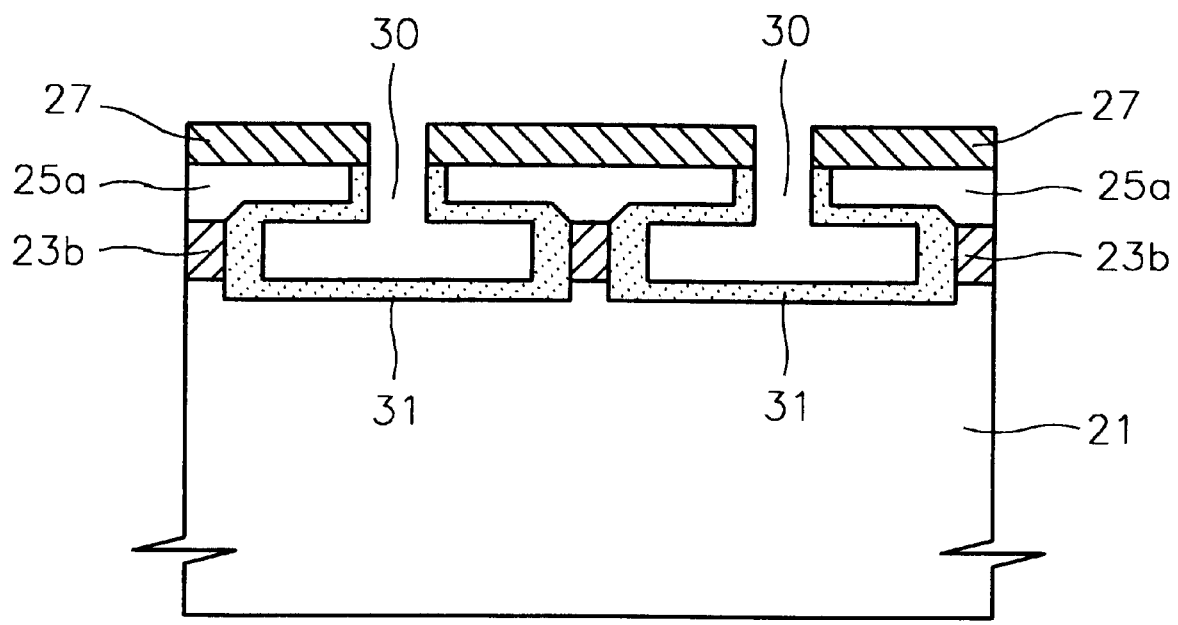

Referring to FIG. 7, the exposed surface of the reverse T-type hole 30 is then thermally oxidized, thereby forming a thermal oxide layer 31. In other words, the thermal oxide layer 31 is formed on the entire surface of the undercut porous silicon pattern 23b, the upper silicon pattern 25a, and lower silicon substrate 21.

Figure 8:
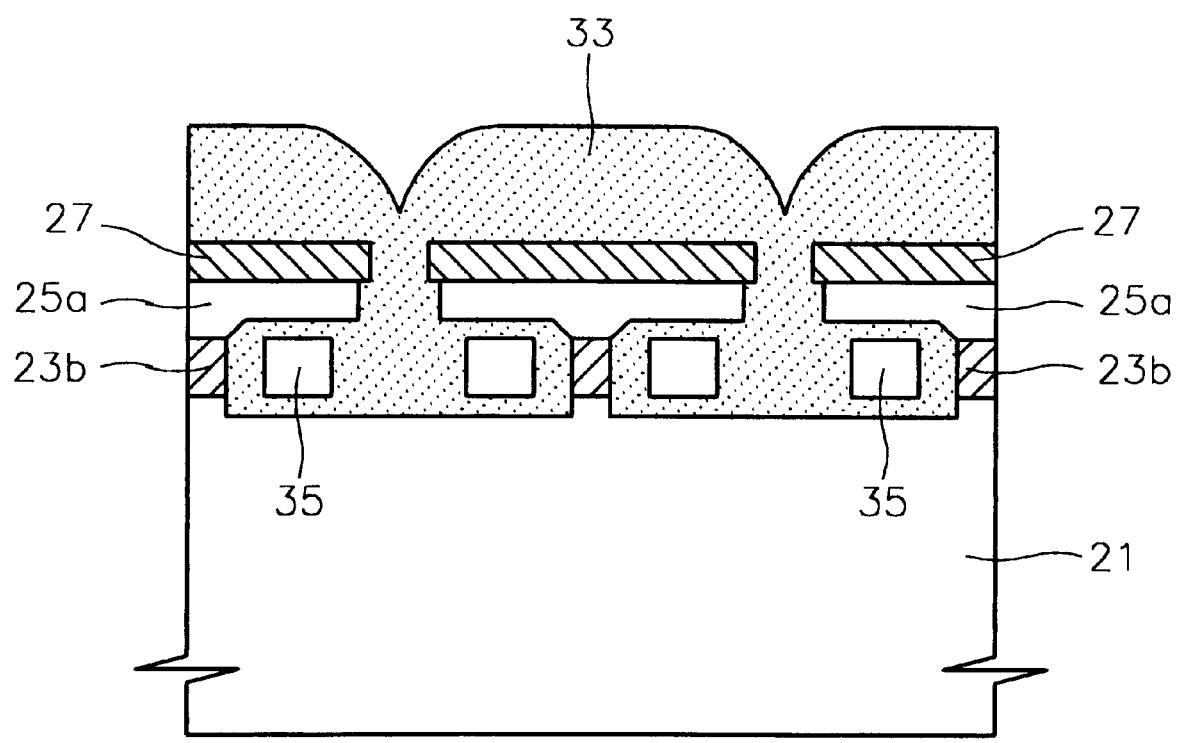

Referring to FIG. 8, an insulation layer 33, e.g., an oxide layer, is formed over the entire surface of the lower silicon substrate 21 and the thermal oxide layer 31, partially filling the reverse T-type hole 30. However, the reverse T-type hole 30 is not completely filled, but rather, an air layer 35 is formed below the upper silicon pattern 25a. Preferably the insulation layer 33 is formed by a chemical vapor deposition (CVD) method.

Figure 9:
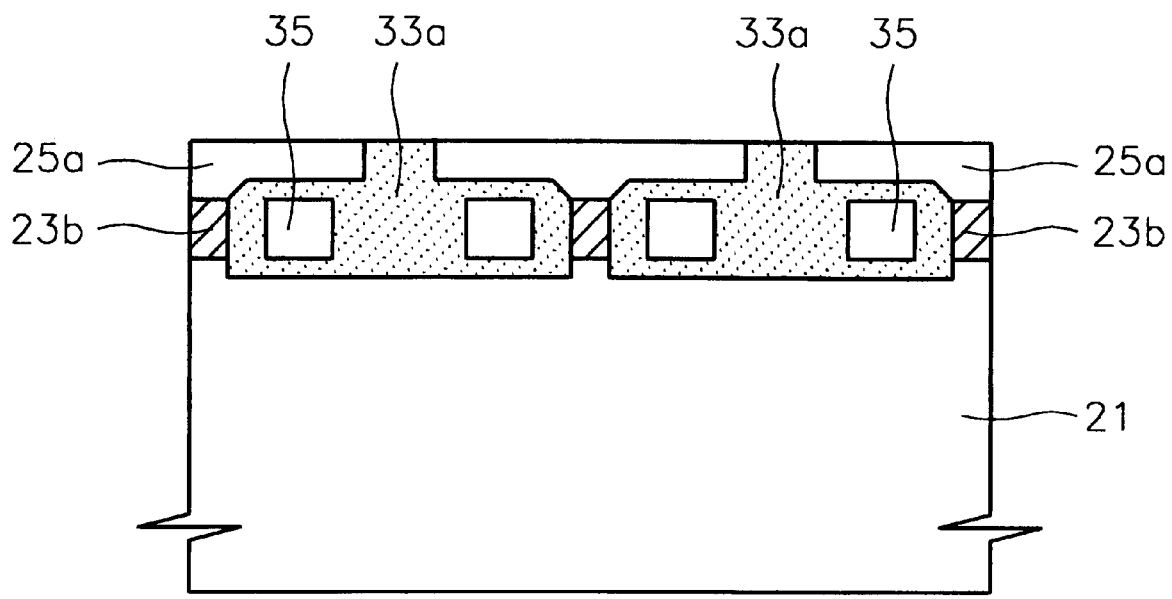

Referring to FIG. 9, the insulation layer 33 is then planarized, preferably by a chemical mechanical polishing (CMP) method, thereby forming an isolating insulation layer 33a. At this stage, the mask pattern 27 is also removed. At this point, the lower silicon substrate 21 is partially isolated from the upper silicon pattern 25a by the isolating insulation layer 33a, and the porous silicon layer 23b allows the upper silicon pattern 25a and the lower silicon substrate 21 to be partially contacted with each other, thereby forming a quasi-SOI structure.

Then, as shown in FIG. 2, the gate insulation layer 38 and the gate electrode 39 are formed over the upper silicon pattern 25a, and then source and drain regions 36 and 37 are formed in the upper silicon pattern 25a, thereby completing the semiconductor device having a quasi-SOI structure.

As noted above, when the insulation layer 33 shown in FIG. 8 is deposited, the air layer 35 is also formed. Thus, the semiconductor device of this embodiment also includes the SOA structure. And because the air layer 35 has a dielectric constant lower than that of an oxide layer used as the insulation layer in the conventional SOI semiconductor device, the resulting device has more effective device characteristics.

FIGS. 10 through 17 are cross-sectional views respectively illustrating the manufacturing process sequence of the semiconductor device of FIG. 3.

Figure 10:
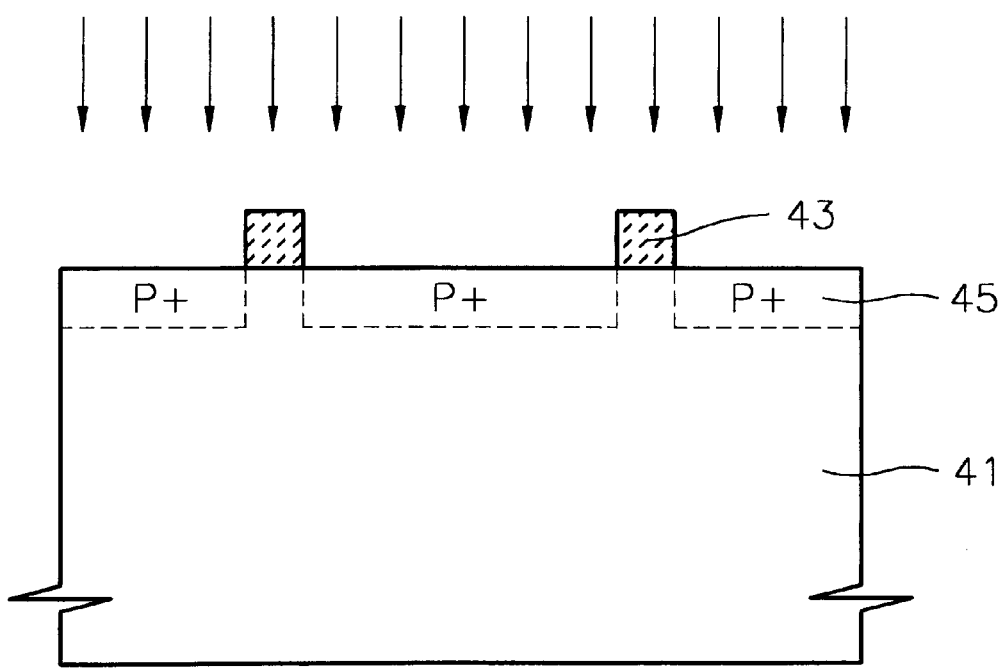
FIGS. 10 through 17 are cross-sectional views respectively illustrating the manufacturing process sequence of the semiconductor device of FIG. 3.

Referring to FIG. 10, a first mask pattern 43 is initially formed over a P-type silicon substrate (i.e., a lower silicon substrate) 41. Subsequently, P-type impurities are implanted into the entire surface of the lower silicon substrate 41 using the first mask pattern 43 as a mask, thereby forming a $P^+$-impurity region 45. In this embodiment, a $P^+$ region is formed in a P-type silicon substrate. However, in alternate embodiments an $N^+$ region may be formed in an N-type silicon substrate.

Figure 11:
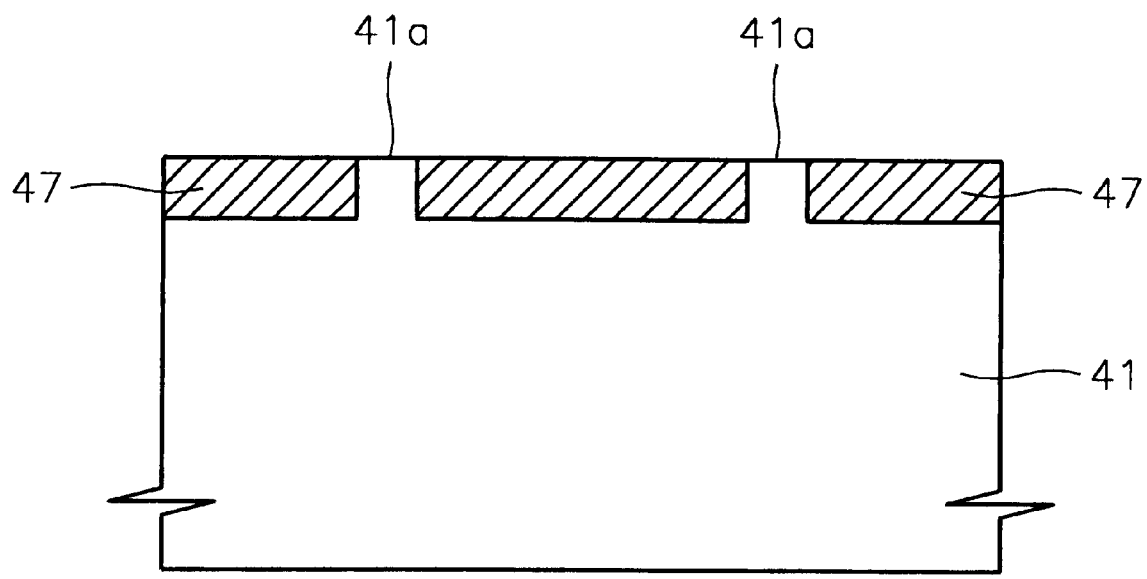

Referring to FIG. 11, the first mask pattern 43 is then removed. Subsequently, as described in the first preferred embodiment, silicon is extracted from the impurity region 45, thereby selectively forming a porous silicon layer 47 on a the lower silicon substrate 41. In other words, the porous silicon layer 47 is formed on a portion exclusive of a first region 41a of the lower silicon substrate 41.

Figure 12:
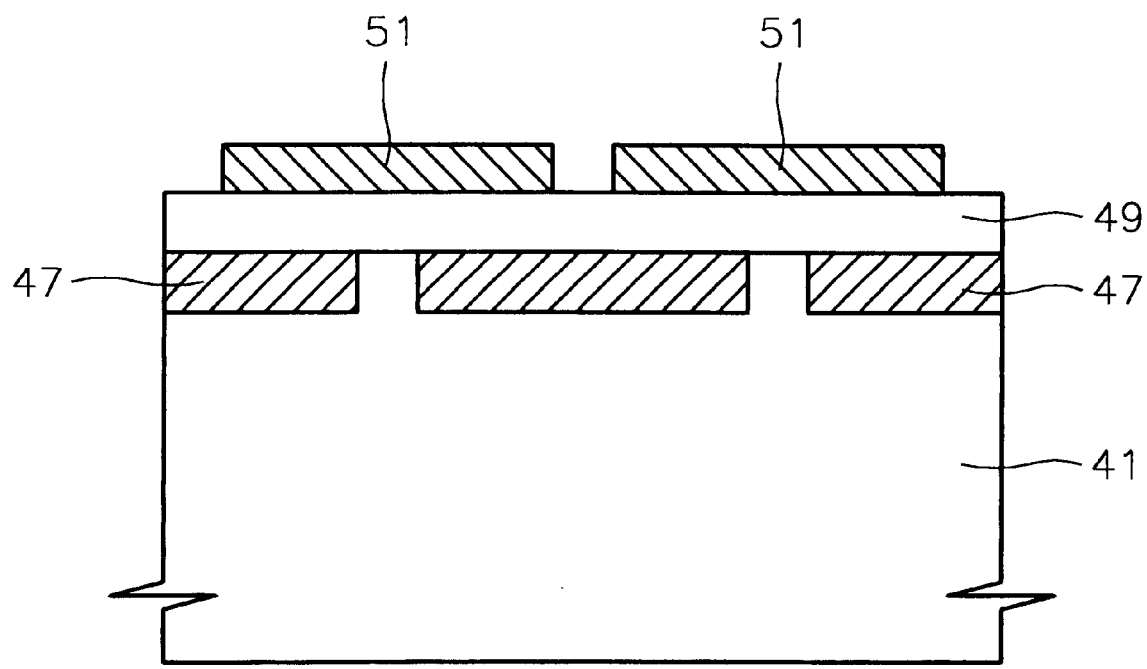

Referring to FIG. 12, a single-crystal upper silicon layer 49 is then formed over the lower silicon substrate 41 and the porous silicon layer 47, preferably using an epitaxy method. Subsequently, a second mask pattern 51 is formed over the upper silicon layer 49. In this embodiment, the second mask pattern 51 is preferably formed using a photolithography method after forming a nitride layer over the upper silicon layer 49.

Figure 13:
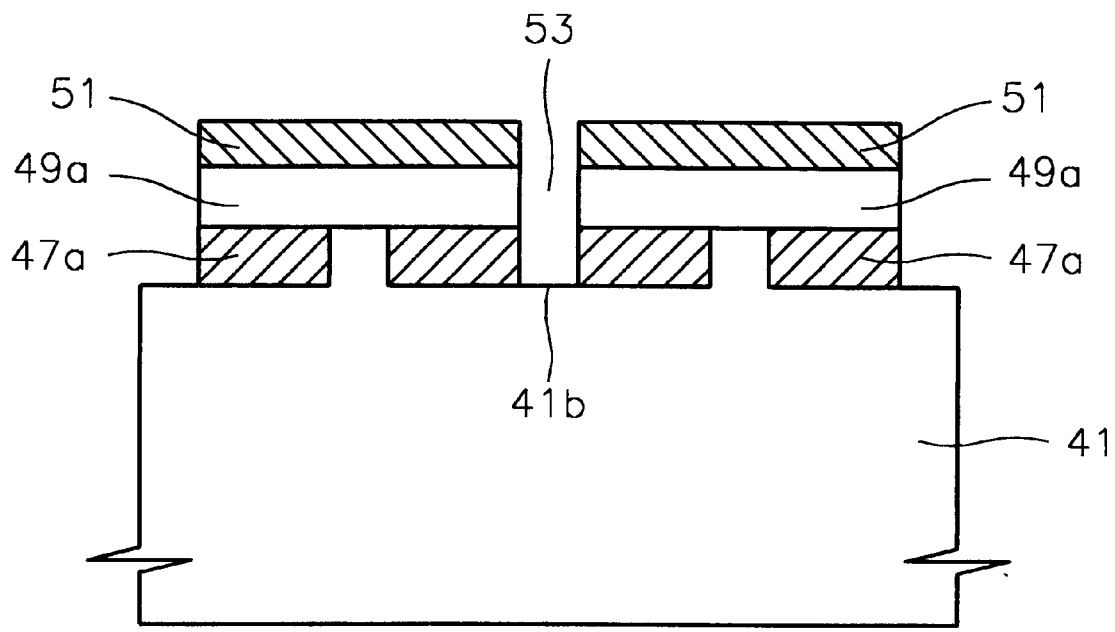

Referring to FIG. 13, the upper silicon layer 49 and the porous silicon layer 47 are then etched using the second mask pattern 51 as an etching mask, thereby forming an upper silicon layer pattern 49a and a porous silicon pattern 47a. A hole 53 is then formed to expose a second region 41b of the lower silicon substrate 41 disposed under the porous silicon layer 47 and to expose the side walls of the porous silicon pattern 47a.

Figure 14:
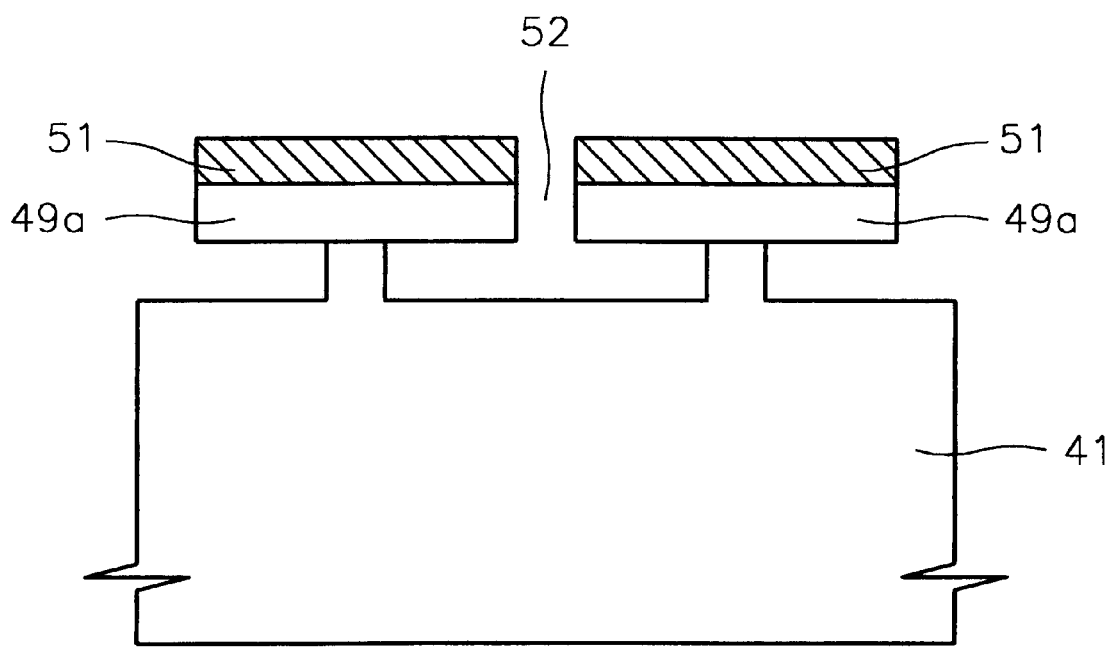

Referring to FIG. 14, the porous silicon pattern 47a is then isotropically etched, preferably using a dilute HF solution having a high etching selectivity with respect to silicon, thereby forming a reverse T-type hole 30 between the upper silicon patterns 49a.

Figure 15:
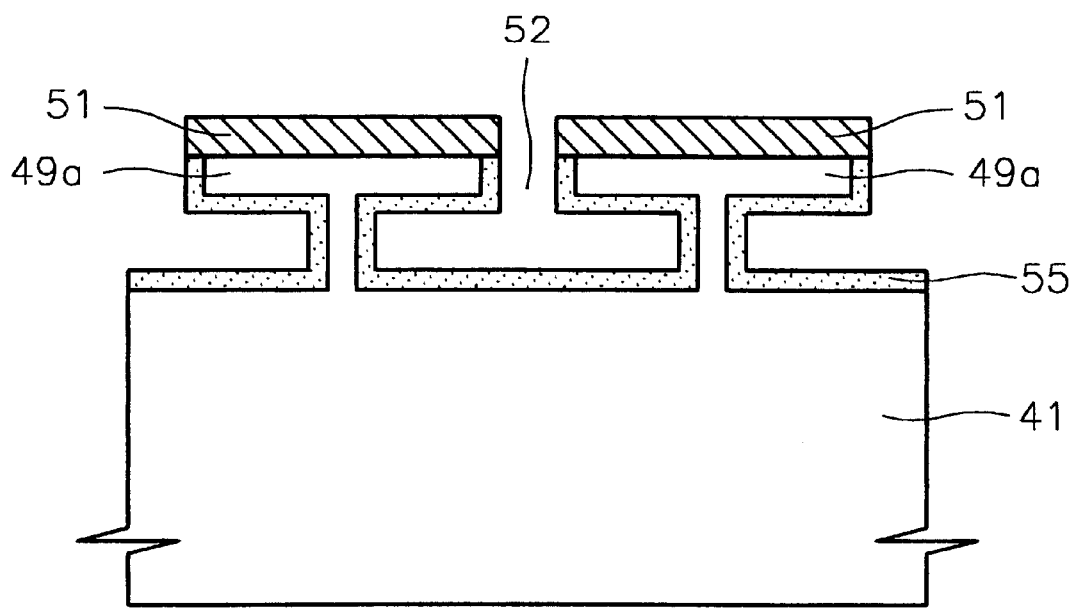

Referring to FIG. 15, the surface of the reverse T-type hole 52 is then thermally oxidized, thereby forming a thermal oxide layer 55. In other words, a thermal oxide layer 55 is formed on the surface of the lower silicon substrate 41, on sidewalls of the first region of the lower silicon substrate 41, and on the lateral surface and bottom of the upper silicon pattern 49.

Figure 16:
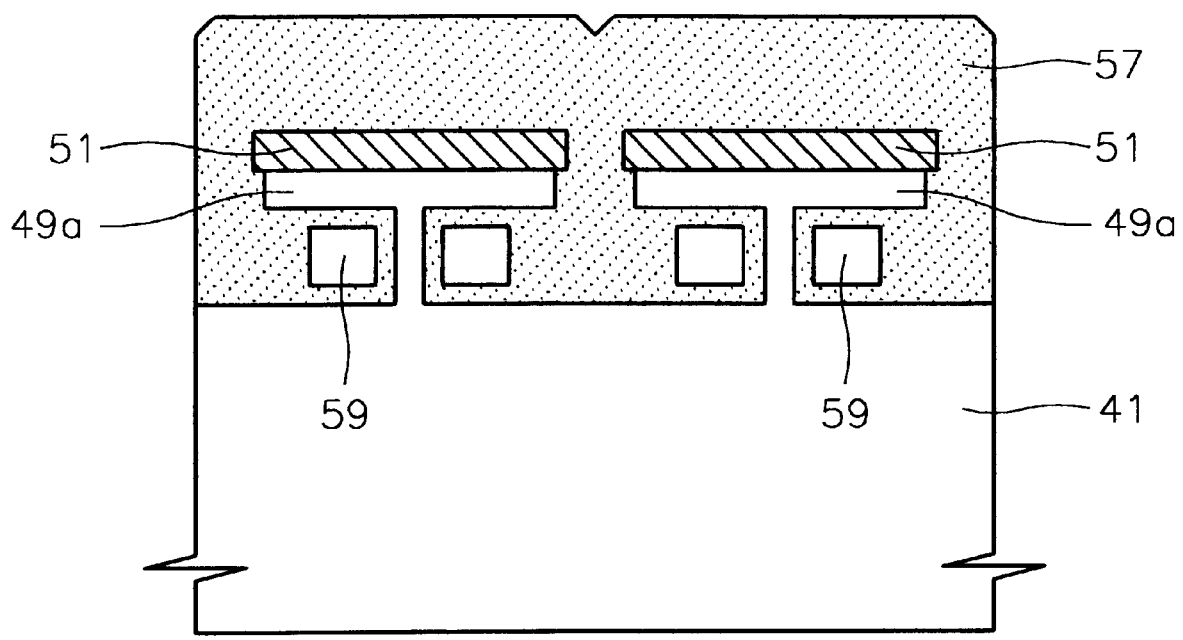

Referring to FIG. 16, an insulation layer 57, e.g., an oxide layer, is then formed over the entire surface of the lower silicon substrate 41 and the thermal oxide layer 55, and in the reverse T-type hole 52, preferably by a CVD method. However, the reverse T-type hole 52 is not completely filled and an air layer 59 is formed below the upper silicon pattern 49a.

Figure 17:
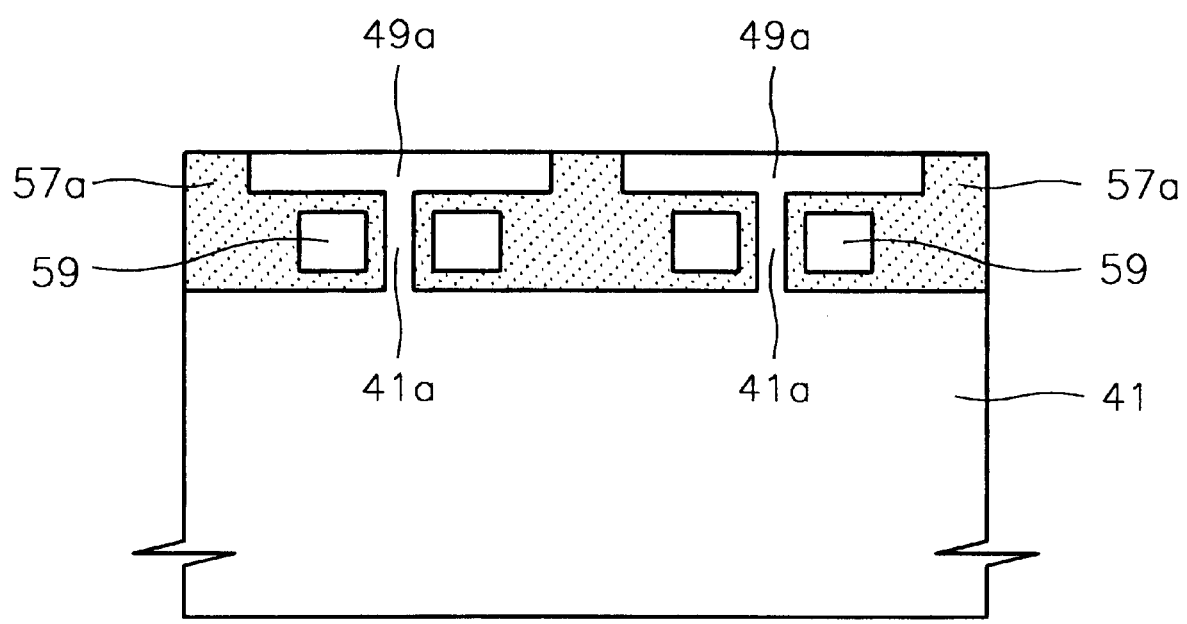

Referring to FIG. 17, the insulation layer 57 is then planarized, preferably by a CMP method, thereby forming an isolating insulation layer 57a. At this stage, the second mask pattern 51 is also removed. As a result of this, the lower silicon substrate 41 is partially insulated from the upper silicon pattern 49a by the isolating insulation layer 57a. However, a silicon layer 41a allows the upper silicon pattern 49a and the lower silicon substrate 41 to be partially contacted with each other, thereby forming a quasi-SOI structure.

Then, as shown in FIG. 3, the gate insulation layer 65 and the gate electrode 67 are formed in the upper silicon pattern 49a of the lower silicon substrate 41, and then source and drain regions 61 and 63 are formed in the upper silicon pattern 49a, thereby completing the semiconductor device having the quasi-SOI structure.

Furthermore, as noted above, when the insulation layer 57 shown in FIG. 16 is filled, the air layer 59 is formed. Thus, the semiconductor device of this embodiment also includes an SOA structure. And because the air layer 59 has a dielectric constant lower than that of an oxide layer used as the insulation layer in the conventional SOI semiconductor device, more effective device characteristics can be obtained.

While the best modes for carrying out the invention have been shown and described in detail, the foregoing description is in all aspects illustrative and not restrictive. It is therefore understood that numerous modifications and variations can be devised without departing from the scope of the invention.

As described above, the semiconductor device having a quasi-SOI structure has a porous silicon layer or a silicon layer under an upper silicon substrate. Accordingly, the porous silicon layer or the silicon layer becomes a passage for partial contact with a lower silicon substrate, thereby allowing a body contact which is the same as that of a general semiconductor device, without a special change in the design of the semiconductor device.

What is claimed is:

1. A semiconductor device having a silicon-on-insulator (SOI) structure, comprising:
   a lower silicon substrate;
   an upper silicon pattern formed over the lower silicon substrate;
   an inverse T-type hole formed between the upper silicon pattern and the lower silicon substrate;
   an isolating insulation layer formed in the inverse T-type hole for partially electrically insulating the upper silicon pattern from the lower silicon substrate;
   a gate insulation layer and a gate electrode formed over the upper silicon pattern;
   a source region formed in the upper silicon pattern adjacent to the gate electrode;
   a drain region formed in the upper silicon pattern adjacent to the gate electrode;
   a channel region formed in the upper silicon pattern between the source and drain regions; and
   a porous silicon layer formed under the channel region for electrically connecting the lower silicon substrate and the upper silicon pattern.

2. A semiconductor device having an SOI structure, as recited in claim 1, wherein an air layer is formed in the isolating insulation layer below the upper silicon pattern.

3. A semiconductor device having an SOI structure, as recited in claim 1, wherein the upper silicon pattern is a single-crystal silicon layer.

* * * * *